United States Patent
Feng

(10) Patent No.: US 7,115,484 B2
(45) Date of Patent: Oct. 3, 2006

(54) METHOD OF DICING A WAFER

(75) Inventor: Yao-Hsin Feng, Hualien (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 65 days.

(21) Appl. No.: 10/983,691

(22) Filed: Nov. 9, 2004

(65) Prior Publication Data

US 2005/0130392 A1    Jun. 16, 2005

(30) Foreign Application Priority Data

Dec. 11, 2003    (TW) ............................... 92135082 A

(51) Int. Cl.
*H01L 21/46* (2006.01)

(52) U.S. Cl. ............... 438/460; 257/678; 257/787; 438/710; 438/795; 156/235

(58) Field of Classification Search ................. 438/795
See application file for complete search history.

(56) References Cited

U.S. PATENT DOCUMENTS

| | | | |
|---|---|---|---|
| 4,793,883 A * | 12/1988 | Sheyon et al. ............... 156/235 |
| 6,175,162 B1 * | 1/2001 | Kao et al. .................... 257/787 |
| 6,264,535 B1 | 7/2001 | Chang et al. |
| 6,649,445 B1 * | 11/2003 | Qi et al. ...................... 438/108 |
| 2001/0005043 A1 * | 6/2001 | Nakanishi et al. .......... 257/678 |
| 2004/0121611 A1 * | 6/2004 | Arita .......................... 438/710 |

* cited by examiner

*Primary Examiner*—Walter Lindsay, Jr.
*Assistant Examiner*—Thu-Huong Dinh
(74) *Attorney, Agent, or Firm*—Bacon & Thomas, PLLC

(57) ABSTRACT

A method of dicing a wafer is disclosed. A wafer with an active surface and a back surface is provided. Prior to dicing the wafer, a removable layer is formed on the back surface of the wafer. The removable layer is attached to a tape, such as a sawing tape. After the wafer is singulated and the adhesion of the removable layer is reduced or removed, the separate chips singulated from the wafer are easily removed from the tape. Because of the removable layer attached on the back surface of the wafer, the cutting stress caused by singulating the wafer will be transferred without concentrated at the back surface of the wafer so as to prevent the wafer from chipping and being warped.

13 Claims, 5 Drawing Sheets

METHOD OF DICING A WAFER

BACKGROUND OF THE INVENTION

1. Field of Invention

This invention relates to a method of dicing a wafer. More particularly, the present invention is related to a method of dicing a wafer with a removable layer formed thereon for reducing the stress at the wafer so as to prevent the wafer from chipping when the singulating process is performed to dice the wafer.

2. Related Art

In this information explosion age, integrated circuits products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. Flip chip is one of the most commonly used techniques for forming an integrated circuits package. Moreover, compared with a wire-bonding package or a tape automated bonding (TAB) package, a flip-chip package uses a shorter electrical path on average and has a better overall electrical performance. In a flip-chip package, the bonding pads on a chip and the contacts on a substrate are connected together through a plurality of bumps formed on the chip by a conventional bumping process and then an underfill material is filled into the gap between the chip and the substrate to encapsulate the bumps so as to well protect the bumps. In such a manner, the reliability of such flip chip package is enhanced.

As mentioned above, in a conventional assembly packaging process, there is provided a wafer with a back surface and a sawing tape formed on said back surface to fix the wafer onto a carrier for proceeding the process of dicing or singulating the wafer. Afterwards, the wafer is sawed by a blade sawing along the cutting lines on the active surface of the wafer so as to form a plurality of separate chips attached on the sawing tape. However, usually the sawing tape is securely attached to the back surface of the wafer so that it is not easy to remove the separate chips from the sawing tape. In addition, when the sawing blade cuts the wafer along the cutting lines, the blade usually not only cuts the wafer but also the sawing tape. To be noted, the sawing tape is partially cut. Besides, the stress caused by the sawing blade cutting the wafer is transferred to and concentrated at the back surface of the wafer so as to cause the back surface of the wafer to be chipping.

As disclosed in U.S. Pat. No. 6,264,535, there is disclosed a method of singulating a wafer for preventing the back surface of the wafer from chipping. Therein, firstly, there is provided a first tape attached to the back surface of the wafer and then a singulating process is performed to partially cut the wafer to form a partially separated wafer. Next, there is provided a second tape on the active surface of the partially separated wafer, namely, the second tape is disposed on the active surfaces of the partially separated wafer. Then, the first tape is removed from the back surface of the partially separated wafer and then a grinding process is performed on the back surface of the partially separated wafer until a plurality of individual chips are formed on the second tape. Next, a third tape is provided on the back surfaces of the individual chips and then the second tape is removed so as to perform the processes of picking and placing. However, as it can be seen, there are a lot of tapes wasted and it is easy to cause the wafer damaged. Frankly speaking, chipping is usually found at the edge of the back surface of the wafer. In other words, when the blade cuts the sawing tape at a cutting depth much smaller than the thickness of the sawing tape, namely, the un-cutting portion is close to the interface of the back surface of the wafer and the sawing tape, it is easy to cause the wafer to be chipping.

Furthermore, another singulating process is disclosed in U.S. Pat. No. 6,175,162. Therein, a protective film is provided on the back surface of the wafer for regarding as a buffer layer to prevent the wafer from being chipping. However, the protective film is still left on the back surfaces of the individual chips so as to lower the thermal reliability of the individual chips. In addition, such protective film has a higher glutinosity, so it is not easy to separate the wafer into a plurality of individual chips.

Therefore, providing another dicing method to solve the mentioned-above disadvantages is the most important task in this invention.

SUMMARY OF THE INVENTION

In view of the above-mentioned problems, an objective of this invention is to provide a method of dicing a wafer to prevent the wafer from chipping. Thus, the reliability of the dicing process will be enhanced.

To achieve these and other advantages and in accordance with the purpose of the invention, as embodied and broadly described herein, the invention specifically provides a method of dicing a wafer. The method mainly comprises providing a wafer having an active surface and a back surface wherein the active surface has a plurality of cutting lines and a plurality of bonding pads formed thereon, and the cutting lines define a plurality of chips, providing a removable layer on the back surface of the wafer, forming a tape on the removable layer, singulating the wafer by cutting the wafer, the removable layer and the tape along the cutting lines to form a plurality of individual chips, separately removable layers and a partially separate tape, and removing the separately removable layers from the individual chips. To be noted, the removable layer is an impermanent adhesive layer with a thickness of at least larger than or equal to 0.05 mm. Besides, the removable layer comprises an adhesive layer and a base layer, wherein the adhesive layer is an impermanent adhesive layer. Because the sawing process is performed on the wafer, the removable layer and the tape, and the un-cutting portion is far away from the interface of the removable layer and the back surface of the wafer so that the stress caused by the sawing process is not concentrated at the back surface of the wafer, Thus, the chipping of the back surface of the wafer will be prevented.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
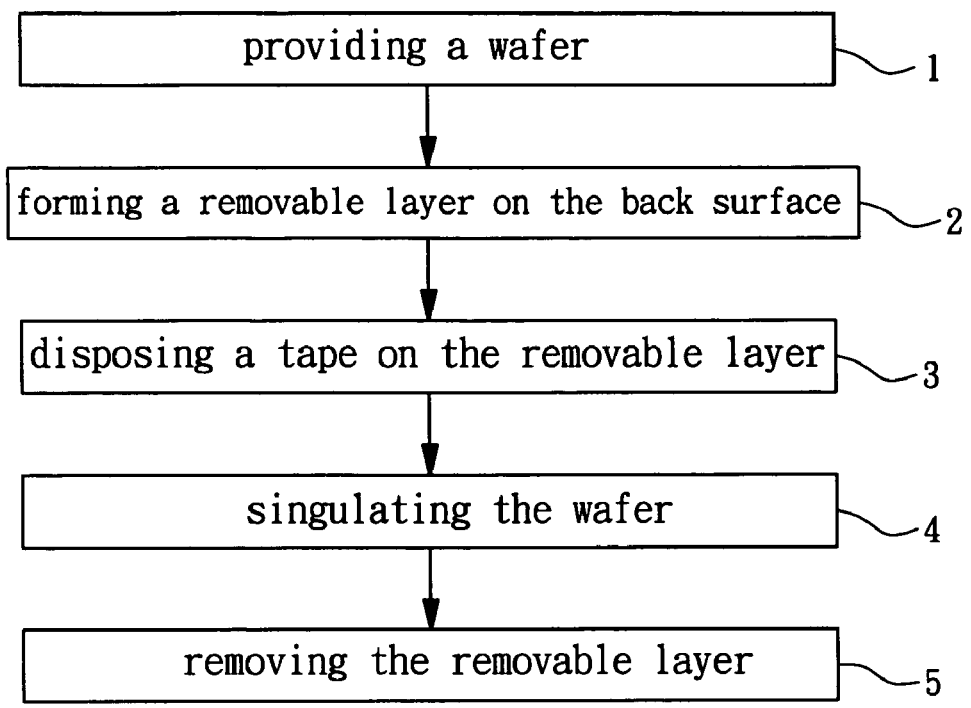
FIG. 1 is a flow chart illustrating the process flow of a method of dicing a wafer according to the preferred embodiment of this invention.

The dicing method thereof according to the preferred embodiment of this invention will be described herein below with reference to the accompanying drawings, wherein the same reference numbers are used in the drawings and the description to refer to the same or like parts.

Figure 2:
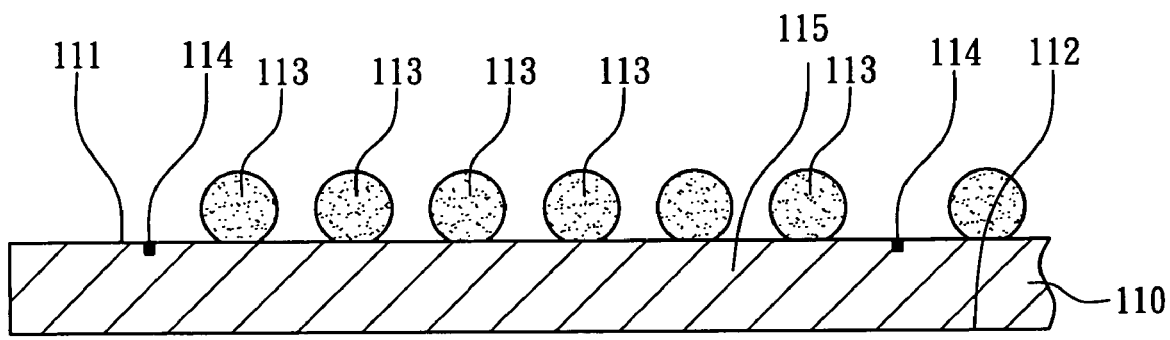
FIGS. 2 to 10 are partially enlarged cross-sectional views showing the progression of steps of dicing a wafer according to the preferred embodiment of this invention.

As shown in FIG. 1, it illustrates a process flow of a method of dicing a wafer. The method mainly comprises the following steps of providing a wafer as shown in step 1, forming a removable layer on a back surface of the wafer as shown in step 2, forming a tape on the removable layer as shown in step 3, singulating the wafer as shown in step 4 and removing the removable layer form the wafer as shown in step 5. Referring to FIG. 2, it illustrates the step 1. Therein, the wafer 110 has an active surface 111 and a back surface 112, wherein the active surface 111 has a plurality of contacts 113, such as bumps, and a plurality of cutting lines 114 defining a plurality of chips 115 formed thereon. To be noted, the bumps 113 can be formed of a material selected from gold, tin-lead alloy, copper, and conductive polymer. Therein, the bumps 113 are reflowed to be securely attached to the wafer 110. Preferably, there is an encapsulation layer formed on the active surface 111 of the wafer 110 (not shown).

Figure 3:
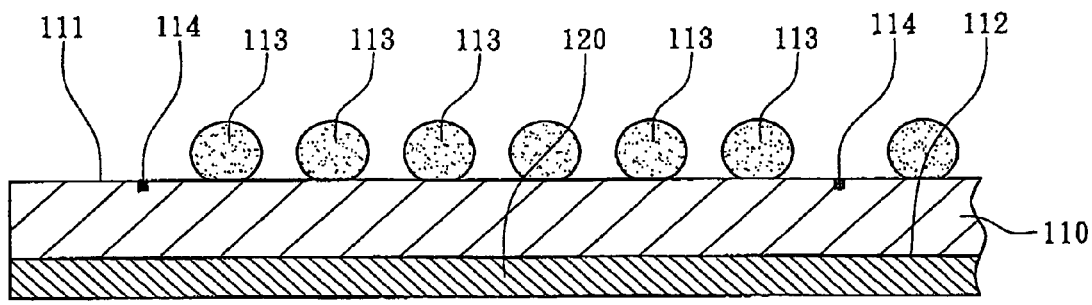

Afterwards, referring to FIG. 3, it illustrates the step 2 of providing a removable layer 120 disposed on the back surface 112 of the wafer 110. Therein, the removable layer 120 can be formed by the methods of spin-coating, printing, and tapping. To be noted, the removable layer 120 is an impermanent adhesive layer, such as an adhesive epoxy layer, a photosensitive layer, thermal activated adhesive layer, such as a thermoplastic layer, and an ultraviolet (UV) tape, film or epoxy. Therein, the removable layer 120 can be reacted with light, heat or chemical solutions so as to reduce the adhesion to the back surface 112 of the wafer 110. Besides, the thickness of the removable layer 120 is equal to or larger than 0.05 mm so as to prevent the back surface of the wafer from chipping at the step 4. In addition, the area of the removable layer 120 may be substantially the same with the area of the wafer 110.

Figure 4:
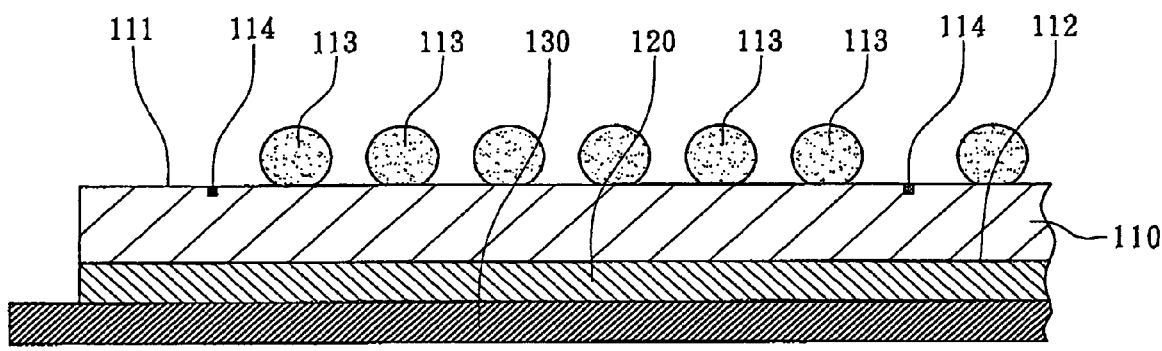

Next, Referring to FIG. 4, it illustrates the step 3 of disposing a tape 130, such as a sawing tape, on the removable layer 120, wherein the tape 130 is directly attached to the removable layer 120 and regarded as a stress transferred layer to reduce the stress at the lower surface of the wafer.

Figure 5:
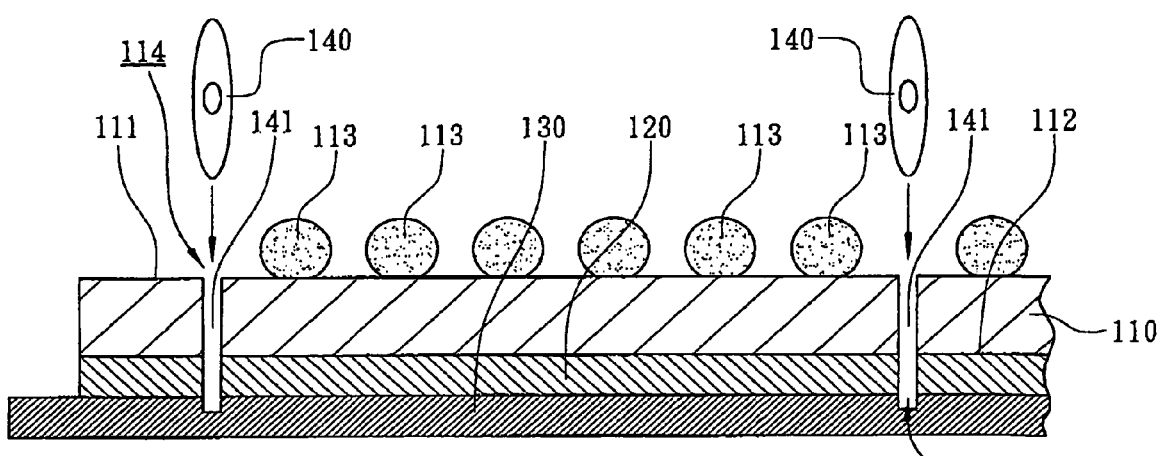

Afterwards, referring to FIG. 5, it illustrates the step 4 of dicing the wafer, wherein the wafer 110 is singulated by a laser or a blade 140 cutting along the cutting lines 114. To be noted, the wafer 110, the removable layer 120 are fully cut by the process of singulation wafer and the tape 130 is partially cut so as to form a plurality of individual chips 115', separately removable layers 120' and partially separately tape 130'. Therein, the individual chips 115' are attached to the separately removable layers 120', and the cutting stress is transferred to and concentrated at the separately removable layers 120' so as to reduce the stress at the back surface of the individual chips 115'. Thus, the wafer 110 will be prevented from being warped.

Figure 6:
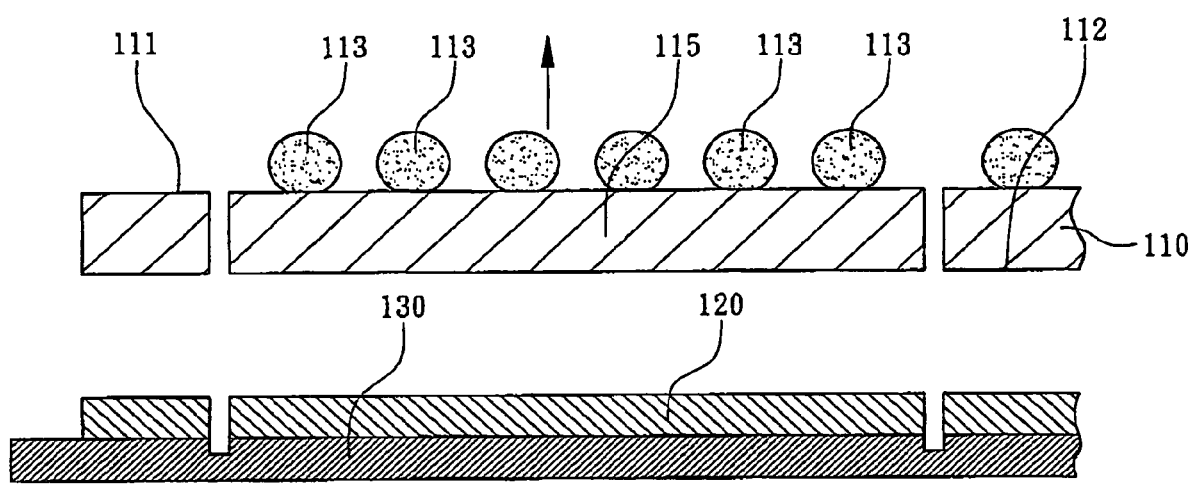

Finally, referring to FIG. 6, in the step 5 of removing the separately removable layer 120' is performed light radiation on the separately removable layer 120', heating the separately removable layer 120' or cooling the separately removable layer 120' to reduce or erase the adhesion of the separately removable layer 120' to the individual chips 115'. In such a manner, the separately removable layer 120' is still attached to the partially separate tape 130' and is easy to be removed from the individual chips 115'. Accordingly, the adhesion of the partially separately tape 130' will not affect the individual chips 150' being removed from the separately removable layer 120'.

Thus, as shown above, the removable layer 120 attached on the back surface of the wafer 110 in the step 4 is provided to transfer the cutting stress from the back surface 112 of the wafer 110 to the removable layer 120 so as to prevent the wafer 110 from chipping. In addition, the tape is not directly attached to the back surface 112 of the wafer 110 so as to reduce the stress directly forcing on the wafer 110. Hence, the wafer 110 will be prevented from being warped.

Figure 7:
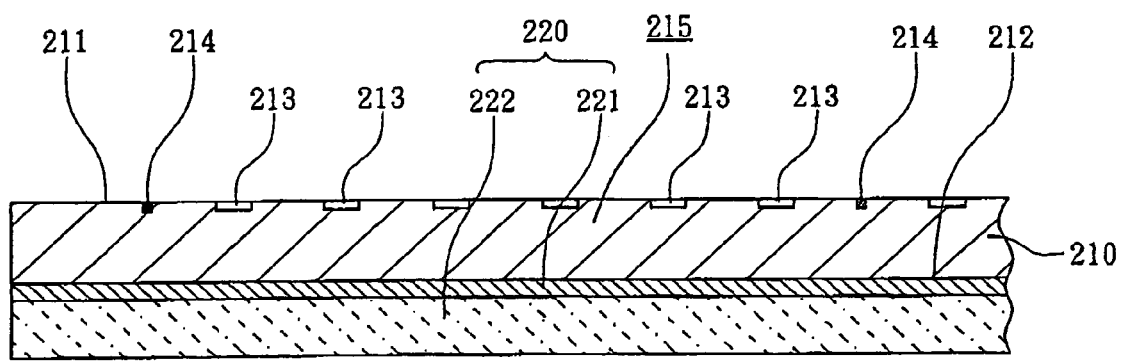
Figure 8:
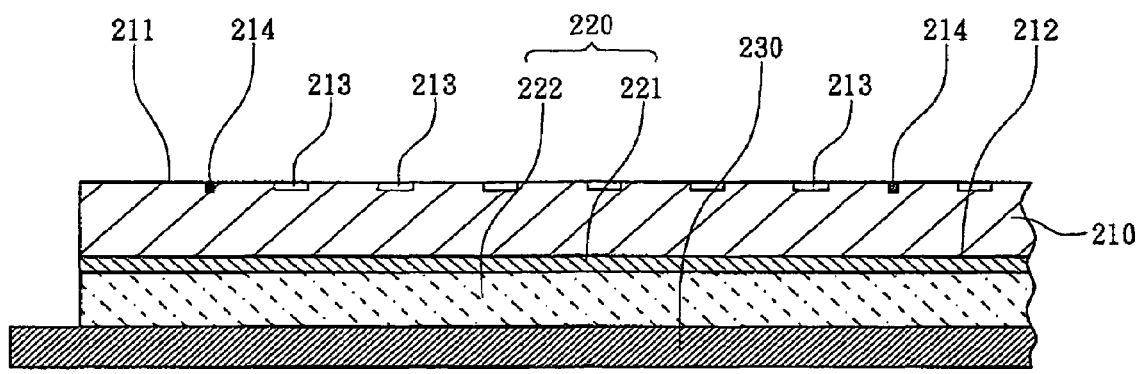
Figure 9:
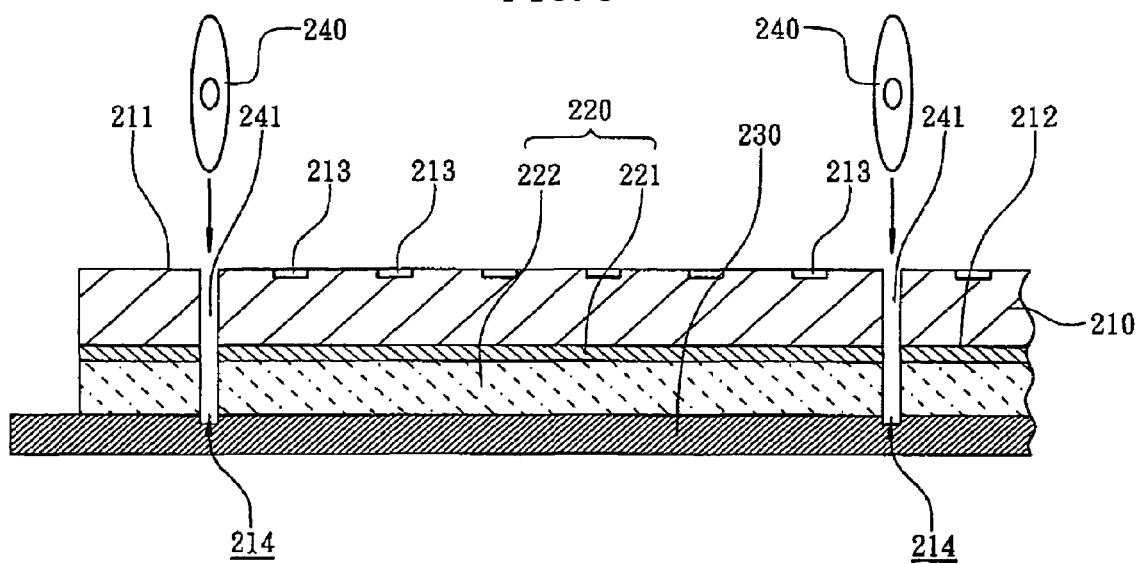
Figure 10:
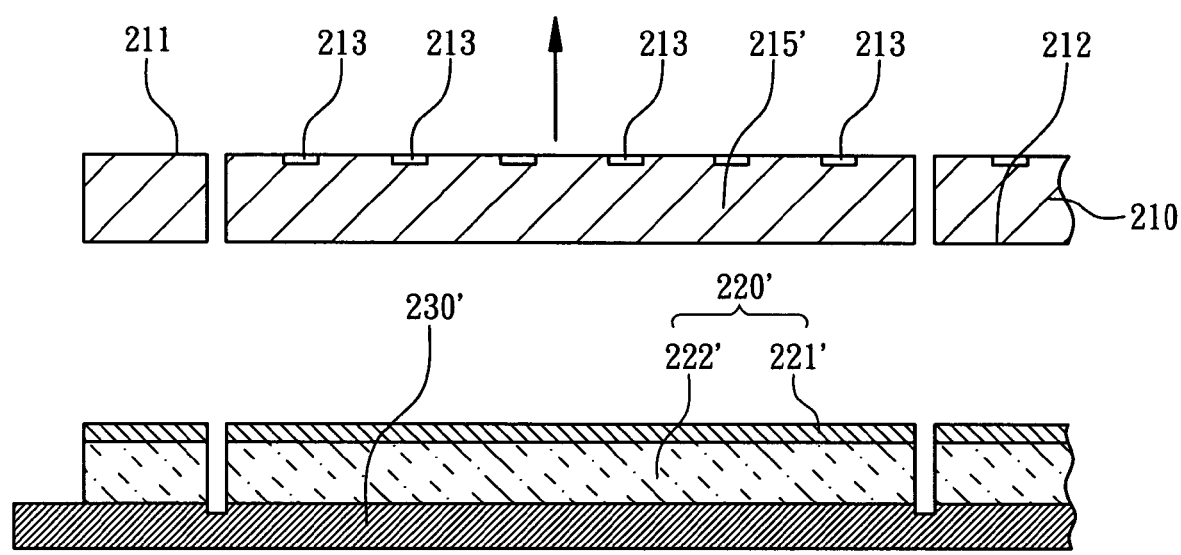

Besides, in the second embodiment of this invention as shown in FIG. 7, there is provided a wafer 210 having an active surface 211 and a back surface 212, wherein the active surface 211 has a plurality of contacts 213 and cutting lines 214 for defining a plurality of chips 215. In addition, there is a removable layer 220 formed on the back surface 212 of the wafer 210. To be noted, the removable layer 220 has an adhesive layer 221 and a base layer 222. The adhesive layer 221 is made of a material which is the same with the material of the removable layer 120 as specified in the first embodiment, and has a thickness larger than, equal to 0.05 mm or less than 0.05 mm. The base layer 222 may be a material selected from silicon wafer, polyimide and reinforced glass fiber. The adhesive layer is an impermanent adhesive layer, namely, it is impermanently attached to the back surface 212 of the wafer 210. Afterwards, referring to FIG. 8, there is provided a sawing tape 230 attached to the base layer 222 of the removable layer 220 and then referring to FIG. 9, there is performed a singulation process as shown in the step 4 of FIG. 1 alone the cutting lines 214 of the wafer 210 so as to form a plurality of individual chips 215' disposed on separately removable layers 220' and over the partially separated sawing tape 230'. Finally, the step 5 of removing the separately removable layers 220' by reducing or erasing the adhesion of the adhesive layer 221 to the individual chips 215' through performing a light radiation, heating or cooling processes. Besides, in the step 4 of singulating the wafer 210, the base layer 222 of the removable layer 220 is fully cut so as to transfer the cutting stress from the back surface 212 of the wafer 210 to the removable layer 220. In such a manner, the chipping will be found at the base layer 222 of the removable layer 220, and the back surface 212 of the wafer 210 will not be chipping due to the adhesive layer 221 located between the base layer 222 and the back surface 212 of the wafer 210. Accordingly, this invention is not only prevented from the wafer 210 being chipping but also transferring the cutting stress from the back surface 212 of the wafer 210 to the removable layer 220. Furthermore, the wafer 210 will be prevented from being warped.

Although the invention has been described in considerable detail with reference to certain preferred embodiments, it will be appreciated and understood that various changes and modifications may be made without departing from the spirit and scope of the invention as defined in the appended claims.

What is claimed is:

1. A method of dicing a wafer, the method comprising the steps of:

providing the wafer having a back surface and an active surface opposing to the back surface;

forming a removable layer on the back surface of the wafer, wherein the removable layer is attached to the back surface impermanently;

disposing a tape on the removable layer;

singulating the wafer, the removable layer and the tape to separate the wafer and the removable layer into a plurality of separate chips and a plurality of separately removable layers, and to partially separate the tape to form a partially separate tape, wherein the separate chips are connected to the partially separate tape through the separately removable layers, wherein the removable layer has a thickness for preventing the wafer from chipping; and removing the separate chips from the separated removable layers.

2. The method of claim 1, wherein the removable layer is an adhesive epoxy.

3. The method of claim 1, wherein the removable layer comprises an adhesive layer and a base layer.

4. The method of claim 3, wherein the adhesive layer is made of a material selected from a thermal activated adhesive, thermoplastic material and a photosensitive material.

5. The method of claim 3, wherein the adhesive layer is an ultraviolet tape.

6. The method of claim 3, wherein the base layer is made of a material selected from dummy wafer, polyimide, and reinforced glass fiber.

7. The method of claim 1, wherein the area of the removable layer is substantially the same with the area of the wafer.

8. The method of claim 1, wherein the step of removing the separate chips from the separately removable layers is performed by the methods selected from performing light radiation on the separately removable layers, heating the separately removable layers and cooling the separately removable layers.

9. The method of claim 1, wherein the removable layer has a thickness larger than 0.05 mm.

10. The method of claim 1, wherein the removable layer is formed on the back surface of the wafer by the methods selected from spin coating, printing and tapping.

11. The method of claim 1, wherein the step of singulating the wafer at least comprises cutting the wafer, the removable layer and the tape.

12. The method of claim 1, wherein the wafer further has a plurality of bumps formed on the active surface.

13. The method of claim 1, wherein the step of singulating the wafer further comprises fully cutting the wafer and the removable layer, and partially cutting the tape.

* * * * *